(12) United States Patent
Kuijk

(10) Patent No.: US 6,426,676 B1
(45) Date of Patent: Jul. 30, 2002

(54) COMPACT DIFFERENTIAL TRANSCONDUCTANCE AMPLIFIER AND A METHOD OF OPERATION THEREOF

(75) Inventor: Maarten Kuijk, Antwerpen (BE)

(73) Assignees: IMEC VZW; VUB, both of (BE)

( * ) Notice: Subject to any disclaimer, the term of this patent is extended or adjusted under 35 U.S.C. 154(b) by 0 days.

(21) Appl. No.: 09/619,753

(22) Filed: Jul. 19, 2000

(30) Foreign Application Priority Data

Jul. 19, 1999 (EP) .............................................. 99870162

(51) Int. Cl.[7] .................................................. H03F 3/45
(52) U.S. Cl. ........................ 330/252; 330/253; 330/292; 330/303
(58) Field of Search ................................ 330/252, 253, 330/292, 303

(56) References Cited

U.S. PATENT DOCUMENTS 4,780,690 A * 10/1988 Voorman .................... 330/303
5,469,092 A    11/1995 Itakura
5,736,892 A     4/1998 Lee

* cited by examiner

*Primary Examiner*—Michael B Shingleton
(74) *Attorney, Agent, or Firm*—Knobbe, Martens, Olson & Bear LLP

(57) ABSTRACT

It is an object of the present invention to disclose a fully differential OTA. The active loads in the two output branches of the OTA show high conductance at low frequency and low conductance at higher frequency. In this way an OTA is constructed with inherent pass-band. Low frequencies are amplified little or even filtered out. The amplification of input referred offset voltage due to mismatches in transistor pairs is similarly reduced. Complementary, in another embodiment of the invention the OTA is of the low-pass type, i.e. also amplifying DC signals. Both OTA's are very compact and the common mode output voltage regulation is in both cases part of the active load structure.

23 Claims, 5 Drawing Sheets

COMPACT DIFFERENTIAL TRANSCONDUCTANCE AMPLIFIER AND A METHOD OF OPERATION THEREOF

FIELD OF THE INVENTION

The present invention relates to the field of differential amplifying circuits, preferably including transistor circuits in a CMOS technology.

BACKGROUND OF THE INVENTION

In a growing number of applications of signal processing, the use of small analogue circuits is required. Small circuits limit the available type of transistors to small transistors, which almost inevitably results in offset problems from poor matching of pairing transistors that are needed as pairs in the circuits. In many applications the input signal is typically smaller (e.g. microvolts) than the input referred offset (e.g. tens of millivolts) of circuits such as an Operational Transconductance Amplifier (OTA) or Operational Amplifier (Opamp) of a preamplifier device. This induces the subsequent amplifier stages to go out of range.

Placing large capacitors in the signal path between amplifier stages is the generally known way in the art to solve this problem. It filters out the lower frequency components of the signal. Including those lateral capacitors in a CMOS circuit typically requires the use of an analogue CMOS technology (with dual polysilicon option). Moreover, to get the low corner frequency of the pass-band at a relative low frequency level, the capacitors need to be very large and occupy a relative large Si-area.

Apart herefrom, another common trend is to use fully symmetric amplifier circuits instead of single ended ones, and to choose for a fully differential signal treatment as a concept. One of the advantages of this strategy is the improved immunity to several kinds of electromagnetic interferences and to power supply ripple and spikes. The known way to the person skilled in the art is to make the OTA or Opamp with an explicit regulating loop to steer the common mode output voltage to a predetermined or predefined voltage level, typically to Vcc/2. Such extra feedback loop makes such a system more complex, larger and thereby requires extra power. Moreover, instead of placing one or more single large capacitors in the signal path, twice the number of these capacitors become required in the differential signal path.

Document US-A-5736892 describes a differential amplifier, which exhibits however no pass band characteristic.

AIMS OF THE INVENTION

It is an aim of the present invention to disclose a compact differential amplifying circuit.

It is another aim of the present invention to disclose a differential amplifying circuit with a built-in band-pass filtering feature and with regulation, preferably self-regulation, of the common mode output voltage of the differential amplifying circuit. The common mode output voltage is the average of the output voltages at the different output nodes of the differential amplifying circuit.

It is yet another aim of the present invention to disclose a differential amplifying circuit where the output voltage level, preferably the common mode voltage level, is regulated by the active load of the circuit and whereby the lower frequency components in the input signal and the input referred offset voltage can get less amplified than the useful frequency components.

Yet according to another aim of the invention, a differential amplifying circuit is disclosed such that it is immune to mismatches between pairing transistors of the circuit. Therefore it becomes possible to work with much smaller transistors and lower current levels, occupying less Si area, and dissipating less power than in prior art circuits.

SUMMARY OF THE INVENTION

The active loads in the two output branches of the differential amplifying circuit of the invention, preferably an Operational Transconductance Amplifier (OTA), can show a high conductance at low frequency and low conductance at higher frequency. In this way an OTA is constructed with inherent pass-band. Low frequencies are amplified little or even filtered out. In an embodiment of the invention wherein the amplifying elements of the amplifier circuit are transistors, the amplification of input referred offset voltage due to mismatches in transistor pairs is similarly reduced. Complementary, in another embodiment of the invention, the OTA is of the lowpass type, i.e. also amplifying DC signals. In both embodiments, both OTA's are very compact and the common mode output voltage regulation is in both cases part of the active load subcircuit.

The terms high frequency and low frequency in the present specification, have a meaning that depends on the specific application wherein the circuit of the invention is used. Generally, with high frequency it is meant signals in the range of 100 MHz up to of the order of GHz or higher. Low frequency signals can range from a few Hz up to 100 MHz.

Thus the present invention is related to a differential amplifying circuit having at least two branches wherein an output node is present, each of said branches comprising a first amplifying element and a load element, said load element including a subcircuit for regulating the signal at the output node of the branch, wherein said subcircuit comprises a second amplifying element with a control terminal and two electrodes and wherein said control terminal is connected via an impedance element with one of said electrodes and wherein the one electrode is connected to said output node.

Preferably the one electrode is directly connected to said output node, i.e. with a metal line connection. Other circuit elements however can be in the connection between the one electrode and the output node. Such circuit elements can include elements such as a resistor element or a switch.

According to an embodiment of the invention, said subcircuit includes a frequency-dependent pass-characteristic.

According to a further embodiment of the invention, said subcircuit includes a low frequency pass filter.

According to a preferred embodiment of the invention, the amplifying elements and impedance elements comprise transistors. According to a further preferred embodiment of the invention, said impedance element comprises at least a transistor operating in the subthreshold regime or in the triode regime.

The control terminals of the two amplifying elements of the two branches of the circuit can be connected to a common node.

Said subcircuit may further comprise at least one additional impedance element, preferably capacitor, element being connected to the other electrode of at least one of the impedance elements of the branches.

Thus the common mode output voltage at the output node of the differential amplifying circuit is determined by the transistor parameters and the operating bias current of the differential amplifying circuit. The regulation of the output common mode is in this way inherently present in the OTA circuit.

In an embodiment of the invention, the differential amplifying circuit can be implemented in a CMOS technology.

In an embodiment of the invention, the branches of the differential amplifying circuit are fully symmetric.

BRIEF DESCRIPTION OF THE DRAWINGS

Exemplary embodiments of the invention and of the use of the invention are shown in the drawings. The drawings are schematic representations of the invention and therefore the dimensions and the relative dimensions do not correspond to actual reductions to practice of the invention.

DETAILED DESCRIPTION OF EMBODIMENTS OF THE INVENTION

Figure 1:
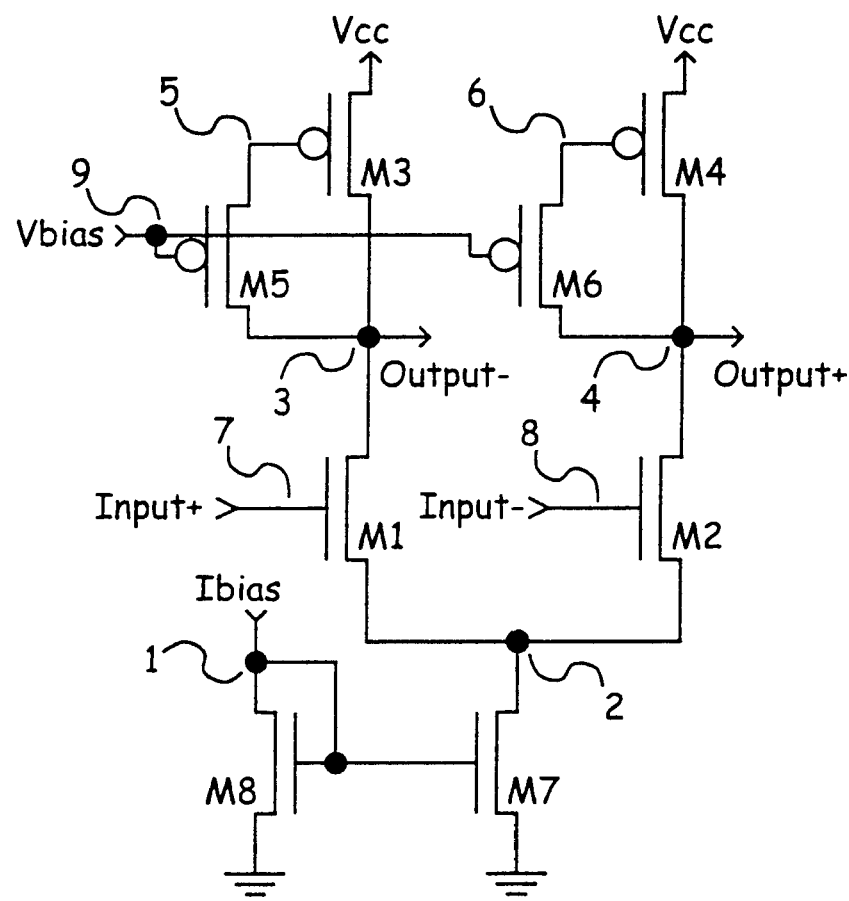
FIG. 1 depicts a preferred embodiment of the differential amplifying circuit of the present invention, with the pass-band filtering option.

The invention is described in the sequel through a detailed description of several embodiments of the invention. It is obvious that other embodiments of the invention can be configured according to the knowledge of persons skilled in the art without departing form the true spirit of the invention, the invention being limited only by the terms of the appended claims. For instance, it will be clear for the person skilled in the art that the present invention is also applicable to the complementary circuits that can be configured by converting all transistors of the PMOS type of the circuits shown herebelow into transistors of the NMOS type and vice versa and by swapping the Vcc and Gnd potentials.

According to an aspect of the invention, a differential amplifying circuit is disclosed having at least two branches wherein an output node is present, each of said branches comprising an amplifying element and a load element, said load element including a subcircuit for regulating the signal at the output node of the branch. The active loads in the two output branches of the differential amplifying circuit, preferably an Operational Transconductance Amplifier (OTA), show a high conductance at low frequency and low conductance at higher frequency. The frequency at which this conductance change happens is referred to as the low corner frequency of the pass band. In the case of an OTA with an NMOS differential pair, the active loads in both parallel branches consist of a PMOS transistor (M3 & M4) connected as a current source, of which the gate is regulated by another PMOS transistor (M5 & M6) operating in triode region or in sub-threshold (see FIG. 1). The common mode output voltage is determined by the PMOS-transistor parameters and the operating bias current. The regulation of the output common mode is in this way inherently present in the OTA circuit. In one embodiment the lower frequencies are only little amplified or even attenuated. This allows the input referred offset to be less deteriorating to the amplification process. This is because the input referred offset can be regarded as an addition to the input signal at DC-frequency. With one or multiple amplifiers of this type in cascade, the input offset gets effectively filtered out, not harming the useful signal. The effect of noise types that are more prominent at low frequency, like 1/f noise, can also be attenuated in this way. To achieve that the low corner frequency of the pass-band starts at a very low level, several options are foreseen. A first option is to place the two biasing transistors M5 & M6 in the sub-threshold regime. This keeps the layout area for the system limited. A leak 23, 24 may be organized to avoid start-up problems (see FIG. 3). A second option is to add a capacitor 26 (also in FIG. 3). A third option is to add two capacitors 21, 22 of which each capacitor has one terminal fixed to the ground or to the Vcc power supply.

Complementary, in another embodiment of the invention the OTA is of the low-pass type, i.e. also amplifying DC signals. This is achieved by adding a wire between the gates of the aforementioned gates of current sources (M13, M14). The advantages of the OTA's compactness and self-regulation of the common mode output voltage remain present.

Figure 4:
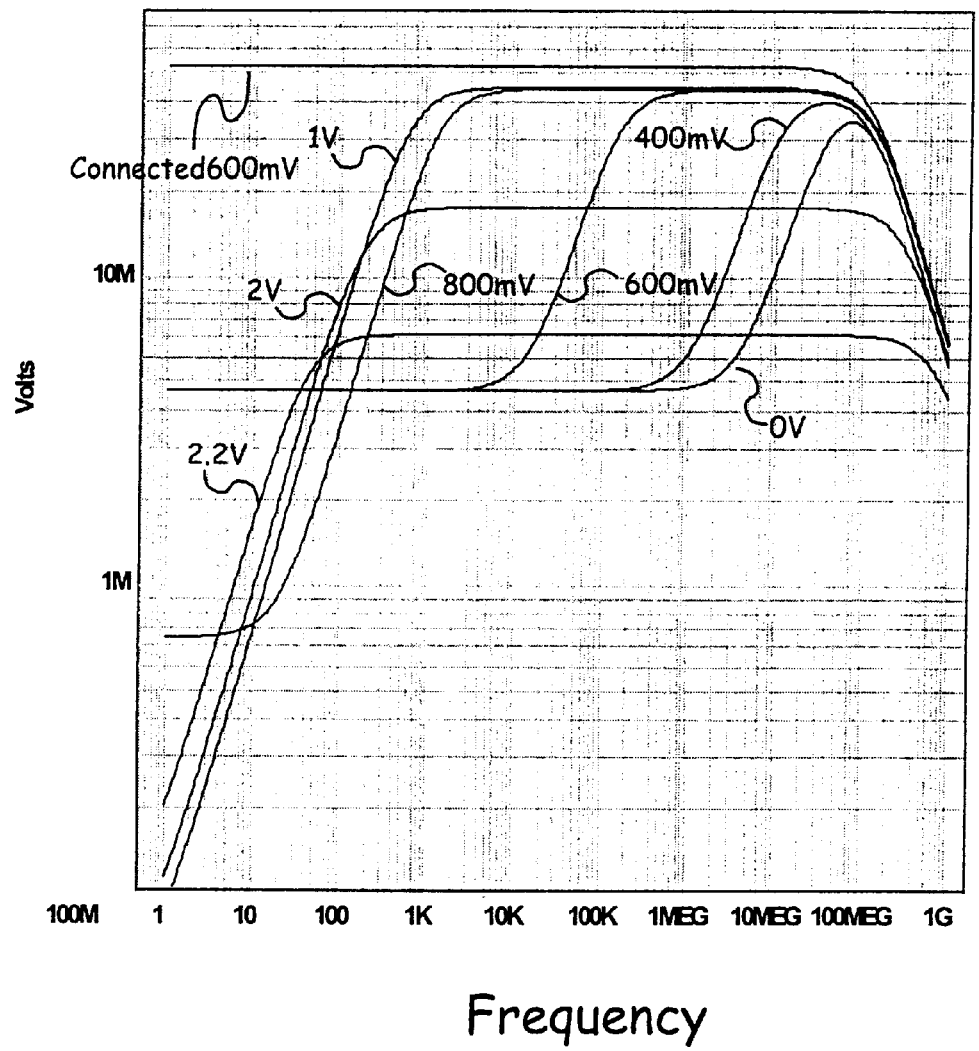
FIG. 4 shows a Spice simulation of the circuit of FIG. 1 wherein the amplitude of the output voltage signal for a 1 mV stimulus on the inputs versus frequency for several Vbias voltages is detailed.
Figure 5:
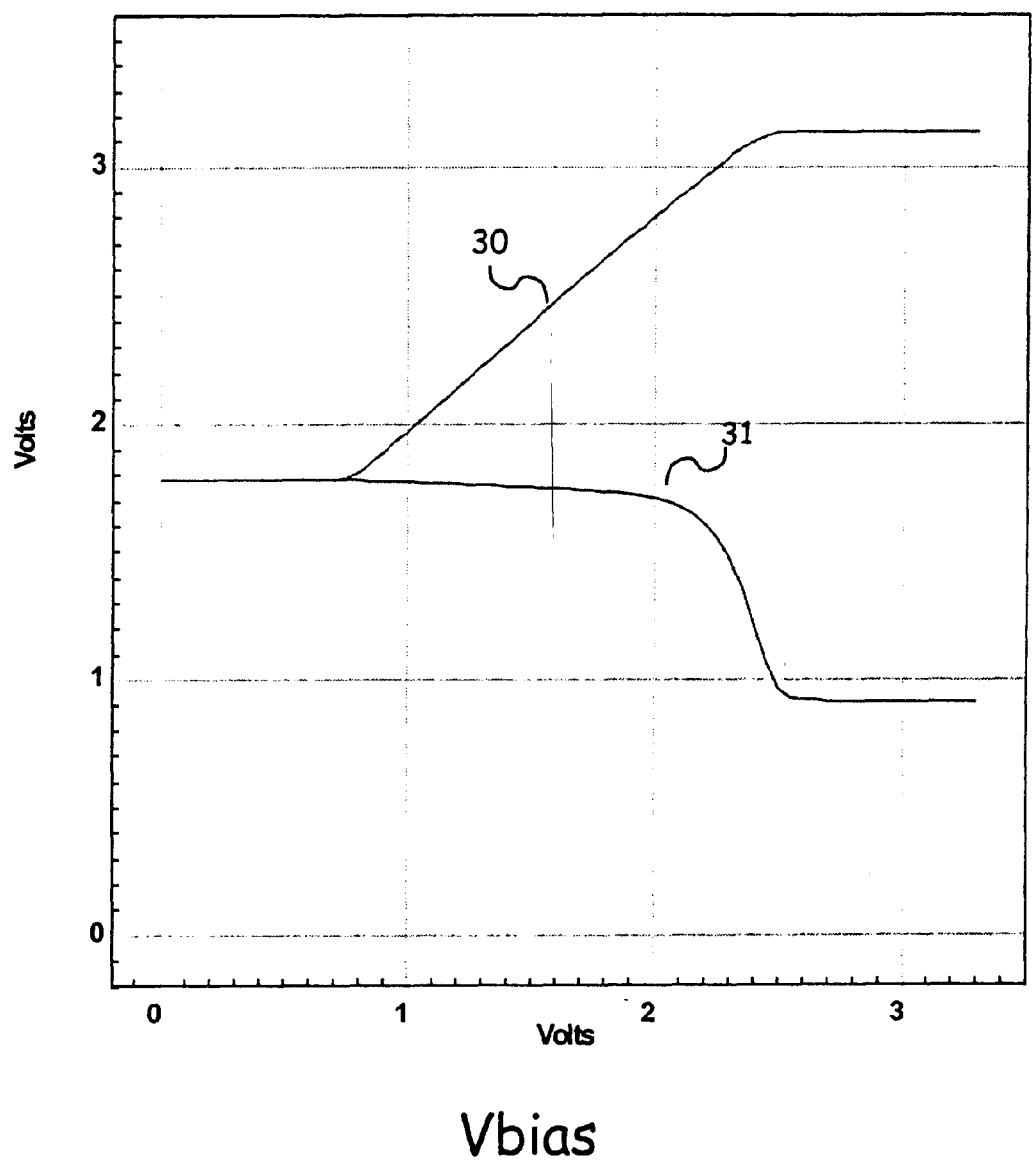
FIG. 5 shows the common mode output voltage 30, and the voltages 31 on nodes 5 and 6 for Vbias between 0 and 3.3V of the circuit of FIG. 1 (Spice simulation).

A preferred embodiment of the present invention is shown in FIG. 1. A differential pair of NMOS transistors M1 and M2 is fed by a current source transistor M7 that mirrors the current Ibias injected in transistor M8. This is a typical way of driving a differential pair of transistors. Transistor M1 sees as active load the combination of transistors M5 and M3. Similarly, M2 sees as active load M4 and M6. Transistors M3 and M4 operate as current source, whereby the current depends on the voltage on their gate nodes 5 and 6. Suppose that Vbias is chosen such that transistors M5 and M6 operate in their triode region. Their functioning can then be summarized as a transistor that mimics a resistor. One side of each of these resistors is then connected to the output node (node 3 for M5 and node 4 for M6), and the other side is connected to the gates of the current sources (transistor M3 and M4 respectively) . These gates have a gate-channel capacitance. The resistance of M5 and M6 and the gate-channel capacitances of M3 and M4 form together two low pass filters. Thus for low frequencies, below the cut-off of these low-pass filters, the voltage at nodes 5 and 6 follow the output nodes 3 and 4 respectively. In other words, the system operates as if nodes 3 and 5 are connected and 4 and 6 are connected. In that way, transistors M3 and M4 are configured as diodes, and the output nodes 3 and 4 have impedance essentially determined by transconductances $g_{m3}$ and $g_{m4}$ respectively. The amplification of the OTA at low frequency is then $g_{m1}/g_{m3}$. The biasing of a system, is a DC question, and falls automatically into this frequency band. At a frequency above the stated cut-off, the nodes 5 and 6 will not follow the output signals, and the conductance of the output nodes becomes $g_{o3}+g_{o1}$ and $g_{o4}+g_{o2}$ respectively. The amplification of the OTA stage is then $g_{m1}/(g_{o3}+g_{o1})$. Since output conductances of transistors in general are much smaller than their transconductances, it is obvious that the amplification of the whole OTA at low frequencies is low, whilst at higher frequencies, it is high. The cut-off frequency of these inherent low-pass filters gives in other words the low corner frequency of the pass-band of the overall OTA. FIG. 4 shows a Spice simulation for the structure in FIG. 1 with a Vcc of 3.3 v, and a Vbias of 600 mV. It illustrates the operation (see curve 600 mV). The low corner frequency of the pass band is about 100 kHz, below this frequency the amplification is about 4.5, and above, the amplification is about 45. The high frequency cut-off is at about 100 MHz for this particular case. The low corner frequency is determined by the choice of the Vbias voltage. The Vbias voltage determines the effective resistance of the transistor M5 and M6, which subsequently determines the cut-off frequency of the internal low-pass filters. Resistors can as well replace transistor M5 and M6, if available in the used CMOS technology. Depending on the application, the value of the required resistors may be too large to remain implementable. Then the configuration with transistors M5 and M6 is an option. FIG. 5 shows two voltages versus the applied Vbias. The voltage represented by curve 30 is the common mode output voltage, and curve 31 represents the voltage on nodes 5 and 6. With Vbias between 0V and 750 mV, the transistors M5 and M6 are in the triode region, acting as voltage controlled resistors, on the contrary, above this voltage, the transistors enter in the sub-threshold region and get in weak inversion. In the latter situation the common mode output voltage increases as Vbias increases. The current conduction through a transistor in weak inversion is much lower than in the triode region, and therefore the low corner of the pass band now lies at a much lower frequency level. This is shown in FIG. 4, where for a Vbias of 1 V this frequency is as low as 1 kHz. If a Vbias of 2 V is applied, the common mode output voltage goes to 2.7 V (see curve 30, FIG. 5). This means that the transistors M3 and M4 are no longer in saturation. Then the amplification weakens, see curve 2V FIG. 4. Thus, if a designer chooses to operate transistors MS and M6 in sub-threshold, the good operation of M3 and M4 should be verified. The advantage to work in sub-threshold regime is, beside a lower corner frequency of the pass-band, a much lower amplification factor at low frequencies. For example, the curves with indication 800 mV, 1V, 2V and 2.2V in FIG. 4 reach values much below 1 mV showing effective attenuation (the stimulus for the simulation is 1 mV).

Figure 3:
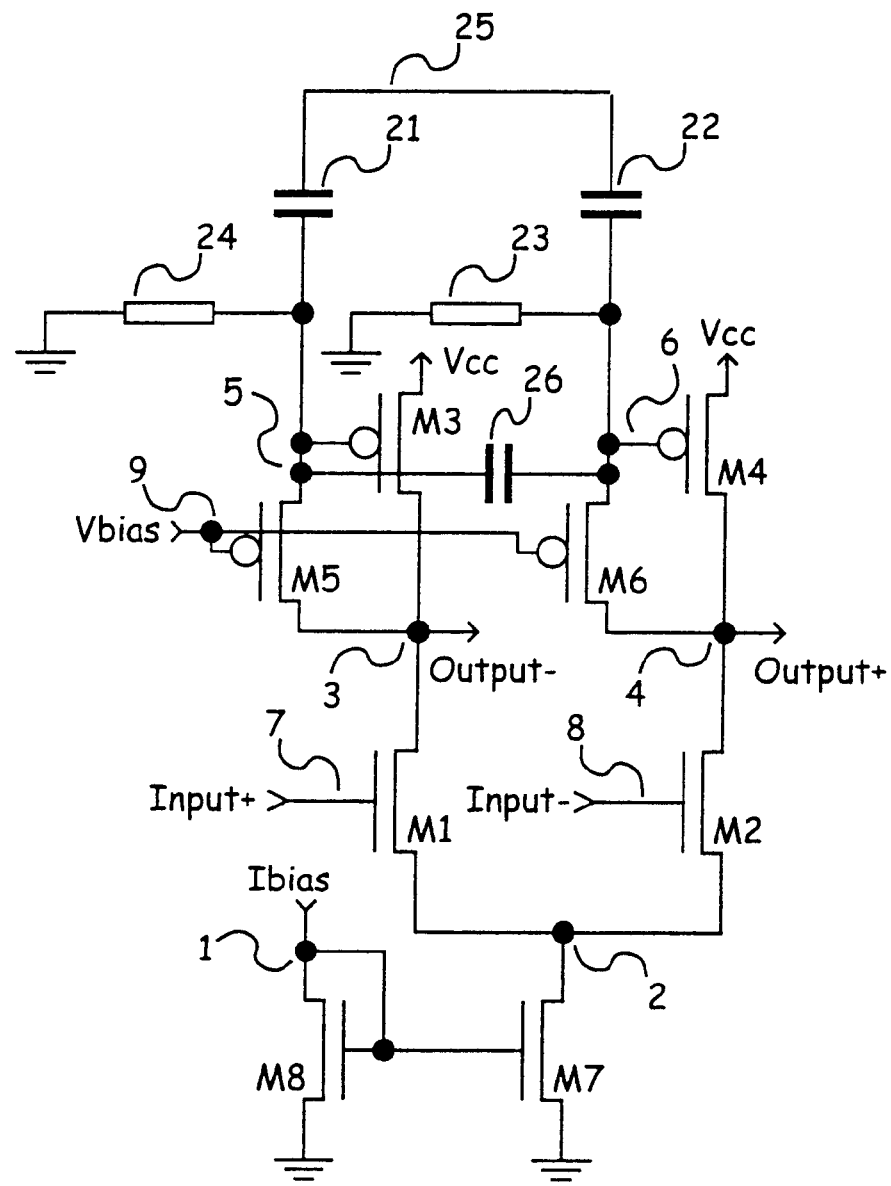
FIG. 3 depicts the preferred embodiment of FIG. 1, with additional capacitor circuit elements.

Another way to lower the low corner frequency is to add elements to the basic circuit of FIG. 1. The most effective is to add capacitance 26 (FIG. 3). It is also possible to add two capacitors 21 and 22 preferably with the same capacitance value. The advantage of the latter solution is that of capacitances 21 and 22, one terminal (node 25) can be connected to Vcc or to ground. In this way, a capacitance can be made using e.g. a gate capacitance, or a semiconductor junction available in CMOS, e.g. from N-Well to substrate. In the case that one chooses to work with M5 and M6 to operate in sub-threshold, it is preferable to organize a small leak (0.1–1 pA) to ground (indicated with impedance elements 23 and 24), enhancing the start-up of the circuit. With these leaks 23 and 24 it is possible to avoid a deadlock situation whereby the output voltage goes to ground. These leaks can be obtained with reverse biased diode junctions, with the cathodes connected to nodes 5 and 6 and the anode connected to ground.

Figure 2:
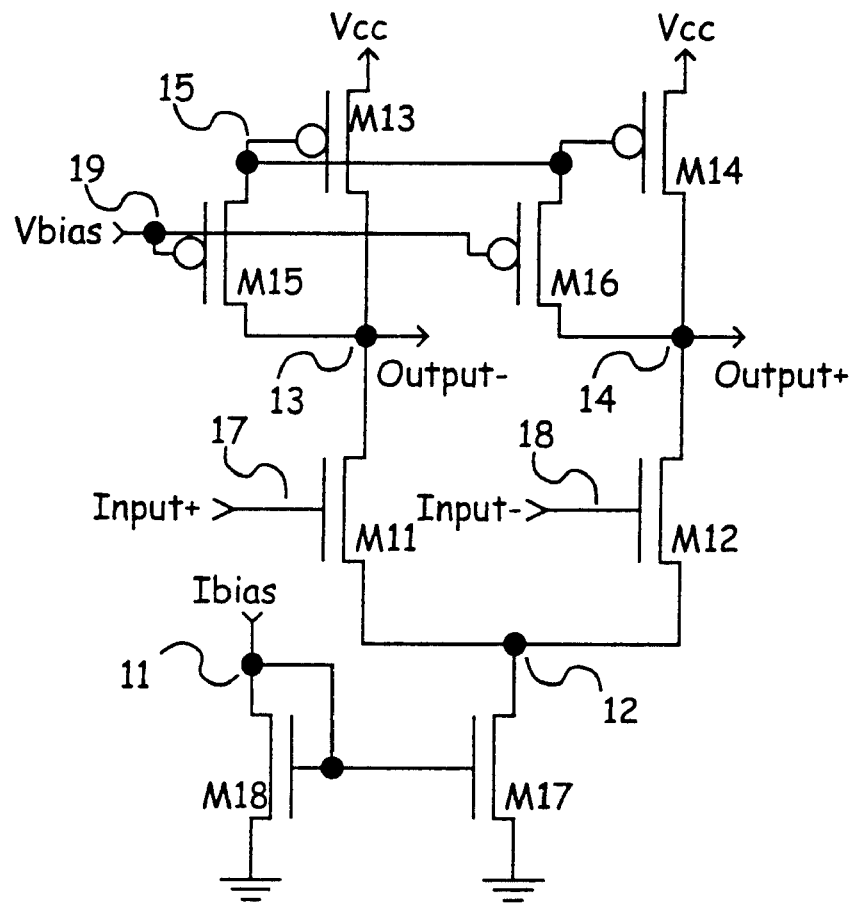
FIG. 2 depicts a preferred embodiment of the differential amplifying circuit of the present invention where the total construction is low-pass.

FIG. 2 shows an embodiment of the invention that is similar to the circuit of FIG. 1. In FIG. 1, the voltages on the two gates of M3 and M4 can change independently, whilst in FIG. 2, the gates of M13 and M14 are connected to each other (node 15). In this embodiment it is advised to connect Vbias to a voltage, small enough such that M15 and M16 remain in the triode region, and large enough that the effective resistance of M15 and M16 does not become too small to weaken the amplification of the OTA. The main function of the circuit of FIG. 2 is a fully differential OTA, however not with a pass-band like the structure of FIG. 1. The curve indicated "connected 600 mV" in FIG. 4 shows that there is no filtering at lower frequency. Again, at high frequency, around 100 MHz, the amplification gets cut-off. Mismatches will get amplified this time, however there is still an advantage with this circuit in that no explicit extra feedback OTA is used to drive the common mode output voltage level to halfway the power supply voltage. This saves Si layout area, and halves the power consumption of the circuit.

What is claimed is:

1. A differential amplifying circuit having at least two branches, each of said branches comprising an output node, a first amplifying element and a load element, said load element including a subcircuit for regulating the signal at the output node of the branch, wherein said subcircuit comprises a second amplifying element with a control terminal and two electrodes and wherein said control terminal is connected via an impedance element with one of said electrodes and wherein the one electrode is connected to said output node and said impedance element comprises at least a transistor.

2. The differential amplifying circuit as recited in claim 1, wherein said subcircuit includes a frequency-dependent pass-characteristic.

3. The differential amplifying circuit as recited in claim 2, wherein said subcircuit includes a low-frequency pass filter.

4. The differential amplifying circuit as recited in claim 1, wherein said transistor is different for each of said branches.

5. The differential amplifying circuit as recited in claim 1, wherein said transistor is operating in the subthreshold regime or in the triode regime.

6. The differential amplifying circuit as recited in claim 1 further comprising at least one additional impedance element, preferably a capacitor, connected between the control terminals of the subcircuits of the at least two branches.

7. The differential amplifying circuit as recited in claim 1 wherein said amplifying element is a transistor.

8. The differential amplifying circuit as recited in claim 1 being implemented in a CMOS technology.

9. The differential amplifying circuit as recited in claim 1 wherein the branches are fully symmetric.

10. A differential amplifying electric circuit comprising:
   a first circuit branch comprising,
      a first output node,
      a first amplifying component connected to the first output node,
      a first load element, wherein the first load element comprises
      a second amplifying component connected to the first output node,
      a first impedance component comprising at least a transistor and connected to the first output node, and
      a first control terminal connecting the second amplifying component to the first impedance component, whereby the first impedance component and the second amplifying component interact through the first control terminal to regulate the signal at the first output node; and
   a second circuit branch comprising,
      a second output node,
      a third amplifying component connected to the second output node,
      a second load element, wherein the second load element comprises
      a fourth amplifying component connected to the second output node,
      a second impedance component connected to the second output node, and
      a second control terminal connecting the fourth amplifying component to the second impedance component, whereby the second impedance component and the fourth amplifying component interact through the second control terminal to regulate the signal at the second output node.

11. The differential amplifying circuit as recited in claim 10, wherein the first load element includes a frequency-dependent pass-characteristic.

12. The differential amplifying circuit as recital in claim 11, wherein the first load element includes a low-frequency pass filter.

13. The differential amplifying circuit as recited in claim 10, wherein the transistor operates in the subthreshold regime or in the triode regime.

14. The differential amplifying circuit as recited in claim 10, wherein the first control terminal is connected to the second control terminal via a capacitor.

15. The differential amplifying circuit as recited in claim 10, wherein the first amplifying component is a transistor.

16. The differential amplifying circuit as recited in claim 10, wherein the circuit is implemented in CMOS technology.

17. The differential amplifying circuit as recited in claim 10, wherein the branches are fully symmetric.

18. A differential amplifying electric circuit comprising:
    a first circuit branch comprising,
        a first output node,
        a first means for amplifying connected to the output node,
        a first load element, wherein the first load element comprises
        a second means for amplifying connected to the first output node,
        a first impedance means comprising at least a transistor connected to the first output node, and
        a first control means for connecting the second means for amplifying to the first impedance means, whereby the first impedance means and the second means for amplifying interact through the first control means to regulate the signal at the first output node;
    a second circuit branch comprising,
        a second output node,
        a third means for amplifying connected to the second output node,
        a second load element, wherein the second load element comprises
        a fourth means for amplifying connected to the second output node,
        a second impedance means connected to the second output node, and
        a second control means for connecting the fourth means for amplifying to the second impedance means, whereby the second impedance means and the fourth means for amplifying interact through the second control means to regulate the signal at the second output node.

19. The differential amplifying electric circuit of claim 18, wherein the first control means and the second control means are connected via a capacitor.

20. The differential amplifying electric circuit of claim 18, wherein the first amplifying means is a transistor.

21. The differential amplifying electric circuit of claim 18, wherein the branches are fully symmetric.

22. A differential amplifying electric circuit comprising:
    a first circuit branch comprising,
        a first output node,
        a first amplifying component connected to the first output node,
        a first load element, wherein the first load element comprises
        a second amplifying component connected to the first output node,
        a first impedance component connected to the first output node, and
        a first control terminal connecting the second amplifying component to the first impedance component, whereby the first impedance component and the second amplifying component interact through the first control terminal to regulate the signal at the first output node;
    a second circuit branch comprising,
        a second output node,
        a third amplifying component connected to the second output node,
        a second load element, wherein the second load element comprises
        a fourth amplifying component connected to the second output node,
        a second impedance component connected to the second output node, and
        a second control terminal connecting the fourth amplifying component to the second impedance component, whereby the second impedance component and the fourth amplifying component interact through the second control terminal to regulate the signal at the second output node; and
    wherein said first control terminal and said second control terminal are not connected.

23. The differential amplifying circuit of claim 22, wherein the first impedance component comprises at least a transistor.

* * * * *